United States Patent
Wippermann et al.

(10) Patent No.: US 11,014,269 B2
(45) Date of Patent: May 25, 2021

(54) DEVICE AND METHOD OF MANUFACTURING A STRUCTURE MADE OF A CURABLE MATERIAL BY MEANS OF MOLDING

(71) Applicant: Fraunhofer-Gesellschaft zur Foerderung der angewandten Forschung e.V., Munich (DE)

(72) Inventors: Frank Wippermann, Meiningen (DE); Andreas Reimann, Apolda (DE); Jens Dunkel, Jena (DE); Andreas Braeuer, Schloeben (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 632 days.

(21) Appl. No.: 14/919,636

(22) Filed: Oct. 21, 2015

(65) Prior Publication Data
US 2016/0039122 A1 Feb. 11, 2016

Related U.S. Application Data

(63) Continuation of application No. PCT/EP2014/057064, filed on Apr. 8, 2014.

(30) Foreign Application Priority Data

Apr. 22, 2013 (DE) .......................... 102013207243

(51) Int. Cl.
*B29C 35/08* (2006.01)
*G03F 7/00* (2006.01)
(Continued)

(52) U.S. Cl.
CPC ...... *B29C 35/0805* (2013.01); *B29C 35/0288* (2013.01); *B29C 37/005* (2013.01);
(Continued)

(58) Field of Classification Search
None
See application file for complete search history.

(56) References Cited

U.S. PATENT DOCUMENTS 3,848,970 A * 11/1974 Goodell ................ H01S 3/0007
219/121.6
4,398,824 A * 8/1983 Feldman ............... G03F 9/7088
356/401

(Continued)

FOREIGN PATENT DOCUMENTS

DE 102009055080 * 6/2011
DE 102009055080 A1 6/2011
(Continued)

*Primary Examiner* — Joseph S Del Sole
*Assistant Examiner* — Manley L Cummins, IV
(74) *Attorney, Agent, or Firm* — Michael A. Glenn; Perkins Coie LLP (57) ABSTRACT

A device for varyingly irradiating by means of ray shaping is described. Furthermore, a method of manufacturing a structure made of a curable material by means of molding is described. In a first step of the method, a molding tool is arranged above a surface such that the curable material abuts on the surface and a molding surface, facing the surface, of the molding tool in a region between the molding tool and the surface and such that further curable material may continue to flow to the region. In a second step, the curable material is irradiated in the region in a locally varying manner such that the ray experiences ray shaping in an optical channel and such that the curable material cures at different speeds in a laterally varying manner.

16 Claims, 10 Drawing Sheets

(51) Int. Cl.
*B29C 37/00* (2006.01)
*B29D 11/00* (2006.01)
*B29C 35/02* (2006.01)
*B29C 43/00* (2006.01)
*B29C 43/32* (2006.01)
*G03F 7/20* (2006.01)
*B29C 43/58* (2006.01)
*B29K 101/00* (2006.01)
*B29K 105/24* (2006.01)

(52) U.S. Cl.
CPC ............ *B29C 43/003* (2013.01); *B29C 43/32* (2013.01); *B29D 11/00442* (2013.01); *G03F 7/0002* (2013.01); *B29C 2035/0827* (2013.01); *B29C 2043/5891* (2013.01); *B29D 11/0048* (2013.01); *B29D 11/00134* (2013.01); *B29D 11/00365* (2013.01); *B29K 2101/00* (2013.01); *B29K 2105/24* (2013.01); *G03F 7/2002* (2013.01); *G03F 7/2065* (2013.01); *G03F 2007/2067* (2013.01)

(56) References Cited

U.S. PATENT DOCUMENTS

| | | | | |
|---|---|---|---|---|
| 4,750,822 A * | 6/1988 | Rosencwaig | .......... | G01N 21/17 356/432 |
| 4,988,274 A | 1/1991 | Kenmochi | | |
| 5,340,992 A * | 8/1994 | Matsugu | .............. | G03F 9/7076 250/548 |
| 5,928,575 A * | 7/1999 | Buazza | ............ | B29D 11/00865 264/1.38 |
| 6,707,612 B2 * | 3/2004 | Ohtsu | .................. | C25D 5/024 359/619 |
| 6,797,531 B2 * | 9/2004 | Ohtsu | .................. | G02B 3/0031 359/620 |
| 6,954,275 B2 * | 10/2005 | Choi | .................... | B29C 31/045 250/548 |
| 7,789,647 B2 * | 9/2010 | Kawakami | ............ | B82Y 10/00 425/149 |
| 2001/0045690 A1 | 11/2001 | Brandinger et al. | | |
| 2002/0093648 A1 * | 7/2002 | Nikoonahad | ........ | G01N 21/211 356/237.1 |
| 2004/0001259 A1 * | 1/2004 | Ohtsu | .................. | G02B 3/0031 359/619 |
| 2004/0222539 A1 | 11/2004 | Hagmann et al. | | |
| 2007/0018360 A1 * | 1/2007 | Kolesnychenko | .... | B29C 43/003 264/407 |
| 2007/0234786 A1 * | 10/2007 | Moon | .................... | B82Y 10/00 73/105 |
| 2010/0196526 A1 * | 8/2010 | Yasukochi | ............ | B29C 64/135 425/174.4 |
| 2010/0289190 A1 * | 11/2010 | Kawakami | ............ | B29C 43/021 264/496 |
| 2011/0304825 A1 * | 12/2011 | Sieler | ................ | G02B 27/0101 353/20 |
| 2012/0175796 A1 * | 7/2012 | Wippermann | ........ | B29C 33/405 264/1.36 |
| 2012/0222539 A1 | 9/2012 | Gandara et al. | | |
| 2012/0292801 A1 * | 11/2012 | Maeda | .................. | B82Y 40/00 264/40.5 |

FOREIGN PATENT DOCUMENTS

| | | |
|---|---|---|
| EP | 322353 A2 | 6/1989 |
| EP | 637490 A1 | 2/1995 |
| JP | 01163027 A | 6/1989 |
| JP | 10058550 A | 3/1998 |
| JP | 2003215311 A | 7/2003 |
| JP | 2004025656 A | 1/2004 |
| JP | 2006044017 A | 2/2006 |
| JP | 2006-332678 A | 12/2006 |
| JP | 2007313768 A | 12/2007 |
| JP | 2008030423 A | 2/2008 |
| JP | 2008158183 A | 7/2008 |
| JP | 4515413 B2 | 7/2010 |
| JP | 2012003232 A | 1/2012 |
| KR | 1991-0005553 | 7/1991 |
| WO | 2009069940 A1 | 6/2009 |
| WO | 2011085880 A1 | 7/2011 |

* cited by examiner

DEVICE AND METHOD OF MANUFACTURING A STRUCTURE MADE OF A CURABLE MATERIAL BY MEANS OF MOLDING

CROSS-REFERENCE TO RELATED APPLICATIONS

This application is a continuation of copending International Application No. PCT/EP2014/057064, filed Apr. 8, 2014, which claims priority from German Patent Application No. 10 2013 207 243.0, filed Apr. 22, 2013, which are each incorporated herein in its entirety by this reference thereto.

BACKGROUND OF THE INVENTION

The present invention relates to manufacturing structures made of a curable material by means of molding, and to a method of curing same by radiation.

UV-curing plastics, such as, for example, Ormocere, UV glues from Delo, Norland, Epoxy Technology or Panacol-Elosol, shrink in a range of a few percent while being irradiated. If the plastics are molded during a manufacturing process and irradiated subsequently, the result will be shape deviations between the tool and the molded structure which, in particular, in optical applications are inacceptable.

Molding using UV-curable polymers is done in, among others, two variations and thus in two different types of apparatuses. The method includes either molding many structures at the same time in parallel on a large area, or repeatedly molding individual structures in a sequential process, wherein the individual molding processes are done on a common substrate spatially next to one another.

The first process variation mostly takes place in a mask aligner which allows precise positioning of the molding tool relative to marks on the substrate which is to be molded onto. For curing, the polymer on the substrate is irradiated by UV radiation through the tool or through the substrate and thereby cured.

A potential method for irradiating through the tool or the substrate is known from DE10 2009 055 080 A1.

The second process variation mostly takes place in a so-called Step &Repeat machine, which may exemplarily be an adapted nano-imprinting lithography apparatus. Thus, a defined quantity of a polymer to be cured is deposited onto a substrate such that a polymer drop forms on the substrate. Subsequently, a molding tool is positioned on the drop such that the drop, on the one hand, takes the shape of the structure to be and, on the other hand, may be positioned on the substrate using the molding tool.

Subsequently, the polymer is cured by means of UV radiation, wherein the UV radiation may cause the polymer to be cured, for example, through a transparent molding tool or through the substrate.

After curing of the polymer, the molding tool is removed and positioned on another drop of polymer positioned there in the meantime in order to mold the next structure. In this way, all the structures to be molded are applied on the substrate one after the other. Such a method allows any pattern of individual structures of the molding tool on the substrate with a positional precision of better than 1 µm.

Figure 11:
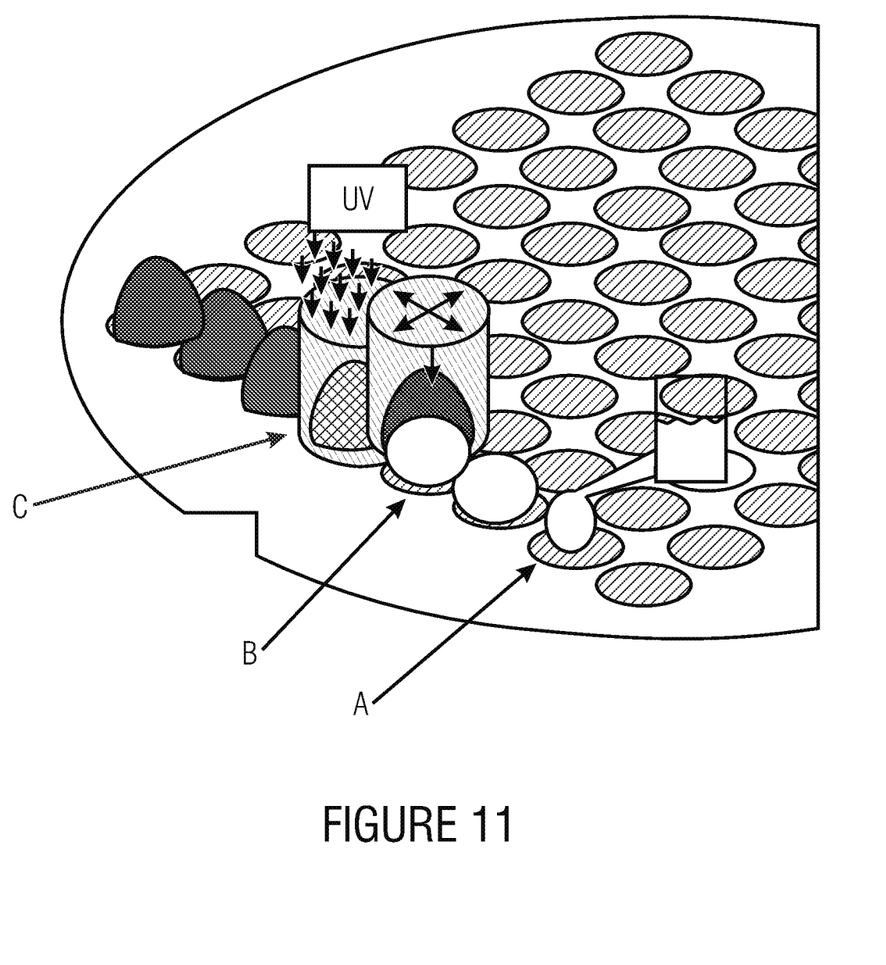
FIG. 11 is an illustration of a molding and curing process using a Step & Repeat machine.

A potential flow of the individual process steps is illustrated in FIG. 11.

Both during the parallel process and during the sequential process, material shrinking while curing the polymer has the result that the shape of the optical structure, exemplarily of the lens, predetermined by the molding tool cannot be met precisely and thus imprecisions may occur in the lens or mechanical tension induced by the shrinkage results in the substrate to be deformed. DE10 2009 055 080 A1 discusses a method which allows material shrinkage while curing to be compensated by a polymer continuing to flow or reflowing. A locally varying irradiation is done here such that a variable shutter with a variable aperture size allows a variable intensity of the curing radiation and a variable size of the curing zone generated such that at first a central region of the lens to be formed is cured, the material shrinkage occurring there may be compensated by material continuing to flow and subsequently the peripheral regions of the lens may be cured.

In this method, determining the curing zone takes place by the cast shadow caused by the variable shutter. Thus, curing the polymer takes place by means of a temporal control of the transmission function of the irradiation optics containing a radiation source and a variable shutter. An essential advantage here is that irradiation does not take place, like in other methods, using flood lighting over the entire wafer at the same time, but using a shutter variable in its diameter, such as, for example, a mechanical iris shutter or an LCD display. In spite of the larger contour fidelity of the lenses formed in this way, this process does not allow progress of the process to be watched directly, nor judging whether an active intervention in the process is necessitated. There is no further optical adjustment of the curing radiation in the process described.

EP 0 322 353 A2 describes a concept of manufacturing a plastics element by means of a shaping tool including a cavity and a feed channel communicating with the cavity.

Consequently, a concept allowing controllable curing and molding and, thus, a reduction in manufacturing rejects would be desirable.

SUMMARY

According to an embodiment, a device for manufacturing a structure made of a curable material by means of molding may have: a molding tool having a molding surface; means for arranging the molding tool above a surface such that the curable material is abutting on a region between the surface and the molding surface, facing the surface, of the molding tool and such that further curable material may continue to flow to the region; an image sensor; and an irradiation unit having a radiation source and an optical channel; wherein the irradiation unit is configured to perform locally varying irradiation of the curable material in the region such that the curable material cures with varying speed laterally along the surface in a varying manner and shrinking when curing the curable material is compensated by the further curable material; wherein the optical channel has at least a first optical element for ray-shaping radiation emitted by the radiation source such that the radiation experiences ray focusing when crossing the optical channel in the direction towards the molding tool; characterized in that the optical channel has a ray-splitting element configured to couple out part of radiation reflected from the molding tool and to image the part coupled out onto an image sensor.

According to another embodiment, a method of manufacturing a structure made of a curable material by means of molding may have the steps of: arranging a molding tool above a surface such that the curable material abuts on the surface and a molding surface, facing the surface, of the molding tool in a region between the molding tool and the surface and such that further curable material may continue to flow to the region; irradiating the curable material in the region in a locally varying manner such that the curable material cures at different speeds laterally along the surface and shrinking when curing the curable material is compensated by the further curable material, wherein irradiating in a locally varying manner is performed from a side, facing away from the molding surface, of the molding tool through the molding tool, characterized in that irradiating in a locally varying manner is performed by means of a ray crossing an optical channel arranged between a radiation source and the molding tool and experiencing ray focusing while crossing; wherein part of radiation reflected from the molding tool is coupled out by a ray-splitting element included by the optical channel and the part coupled out is imaged onto an image sensor.

The central idea of the present invention is having recognized that the above object may be achieved by focusing the curing radiation by arranging a ray-shaping optical element in an optical channel between the radiation source and the molding tool. This allows curing the curable polymer to be controlled more precisely.

In accordance with an embodiment, two ray-shaping optical elements are arranged in an optical channel. Thus, a cone of rays widening in the ray direction is shaped by a first ray-shaping optical element to form a ray of approximately constant width and, in the further course of the ray, focused by a second ray-shaping optical element such that the intensity of the radiation increases towards the molding tool. By combining a shutter variable in its aperture size and/or lateral position of the aperture and the ray-shaping elements, the radiation curing the polymer can be controlled exactly and, thus, the precision of the lens contour be improved.

In accordance with an alternative embodiment, a ray-splitting element is arranged between the first and second ray-shaping elements such that part of the radiation emitted by the radiation source is coupled out and may be detected by a camera so as to allow the radiation source to be watched.

In accordance with another embodiment, a ray-splitting element couples out part of the radiation reflected back from the direction of the molding tool and directs it to a camera so as to allow the curing zone to be watched.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
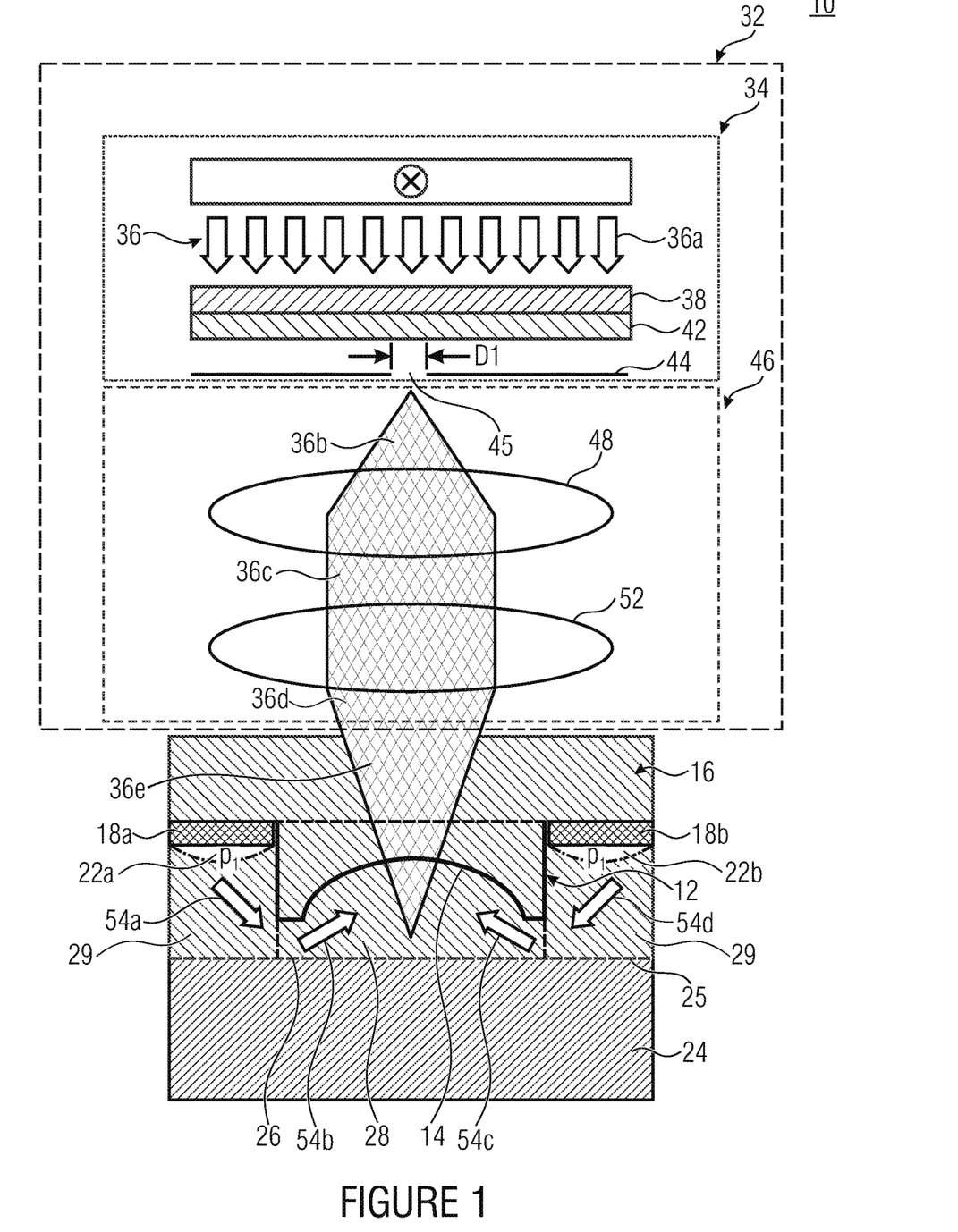
FIG. 1 is a schematic cross-sectional view of a device for curing a curable material, comprising an optical channel and ray-shaping elements.

FIG. 1 shows a device 10 comprising a molding tool 12 which includes a molding surface or molding area 14 and is formed at a tool substrate 16. Membrane layers 18a and 18b are arranged at the tool substrate 16 laterally neighboring to the molding tool 12, the membrane layers being loosely attached at the tool substrate 16 in a channel region and sealing the channel region at the tool substrate in a fluid-tight manner. The channel region sealed in a fluid-tight manner thus forms the channel structures 22a and 22b. The molding surface 14 here may also include a coating which prevents molded material from sticking to the molding tool 12.

The molding tool 12 is positioned relative to a substrate 24 such that a region 26 where curable material 28 is arranged forms between a surface 25 of the substrate 24 and the molding tool 12. Abutting on the region 26, there is more curable material 29 between the membrane structures 18a and 18b and the substrate, the curable material being configured to experience a pressure when applying a pressure $p_1$ in the channel structures 22a and 22b.

An irradiation unit 32 is arranged on that side of the molding tool 12 facing away from the molding surface 14. It comprises a radiation source 34 which emits radiation 36. At their origin, rays of the radiation 36 are approximately parallel. In a ray direction, a gray filter 38 is arranged adjacent to and, in the ray direction, upstream of a diffusion disc 42. The gray filter 38 is configured to moderate the intensity of the radiation 36 if too high. The diffusion disc 42 in contrast is configured to eliminate collimation of the radiation 36 and scatter the radiation 36.

A variable shutter 44 comprising a variable emission area 45 implemented by a variable opening diameter D1 is arranged adjacent to the diffusion disc 42. The variable emission area 45 is configured to have conical radiation 36b, scattered by the diffusion disc 42, leave the radiation source 34 with a cone width controlled by the variable opening diameter D1. An optical channel 46 is arranged between the variable shutter 44 and the tool substrate 16, comprising a first ray-shaping optical element 48 and a second ray-shaping optical element 52 in the further course of the ray direction.

Thus, the two ray-shaping optical elements 48 and 52 are configured to focus incident radiation.

Thus, the first ray-shaping optical element 48 is configured and arranged such that the radiation 36b incident on the first ray-shaping optical element 48 is collimated and the rays of the radiation 36b are approximately parallel to one another in the further course 36c. Due to the approximately parallel course of the rays in the radiation section 36c, the intensity of the radiation remains approximately constant over the course in the radiation direction.

In the ray direction, the radiation 36c is focused by the second ray-forming optical element 52 such that the intensity of the radiation in section 36d increases due to the focusing and has a local maximum in the region 26 where the curable material 28 is arranged while neglecting absorption of the radiation by the curable material next to the surface 25.

Alternatively, the local maximum of the intensity of the radiation 36 may, for example, also be positioned such that it is located between the molding surface 14 and the surface 25. In principle, the local maximum may be positioned at any axial location.

Shrinkage of the curable material 28, triggered by the radiation 36, may be compensated by applying a pressure $p_1$ in the channel regions 22a and 22b such that the pressure $p_1$ in the channel structures 22a and 22b results in a pressure in compensation regions, axially adjacent to the membrane structures 18a and 18b, with further curable material 29 and reflow 54a-d of the further curable material 29 from the compensation region to the region 26 is caused, thereby closing gaps occurring due to material shrinkage. Compensation regions where the further curable material 29 is arranged are arranged such that the further curable material 29 is not irradiated further and, consequently, remains uncured. Here, the radiation 36 is either directed past the further curable material 29, or the further curable material 29 is shielded from the radiation 36, exemplarily by means of a shutter. The compensation regions axially adjacent to the membrane structures 18a and 18b are not part of optical functional regions of the structure to be cured. After having irradiated the structure to be cured, the further curable material 29 may, for example, also be cured by opening the shutter 44 completely, or be removed in a subsequent process step, exemplarily by means of a solvent.

It is possible by means of arranging the two ray-shaping optical elements 48 and 52 to adjust the radiation 36 entering the region 26 with high precision. In combination with the variable shutter 44, the power of the radiation 36 may be controlled so precisely that the contour fidelity and thus the quality of molded lenses may be increased considerably. Thus, the shutter 44 is configured such that the lateral extension of the region irradiated at one time may be controlled by adjusting the size of the emission area 45 of the variable shutter 44, whereas the ray-shaping optical elements 48 and 52 are configured to allow the degree to which the radiation 36 is focused to be controlled and thus allow a point of maximum radiation intensity.

Further optical elements for evaluating the radiation source and/or for observing the curing zone in region 26 may be arranged in the section 36c, as the following embodiments will show.

The variable shutter 44, in combination with the ray-shaping optical element 48 and 52, allows the curable material 28 to be cured variably along the surface 25, with exact adjustment of the curing zone by the ray-shaping optical elements 48 and 52.

Using ray-shaping optics extends the ways of controlling the curing process and allows contour fidelity to be improved further, since the polymer volume irradiated by the UV radiation and, thus, curing, may be shaped optimally depending on how the rays are influenced. Furthermore, it allows the variable shutter and the tool contour to be separated spatially. In the case of a process flow where many structures are molded at the same time and in parallel next to one another by a mask aligner, many like structures, tools and ray-shaping optics are arranged next to one another. In the case of a sequential process flow including a Step & Repeat machine, a single arrangement of tools and ray-shaping optics is employed.

FIG. 1 shows an optical channel 46 including a two-lens optical path formed by the ray-shaping optical elements 48 and 52, which images the plane of the variable shutter 44 to near the curing zone and thus near the substrate surface 25.

Figure 2:
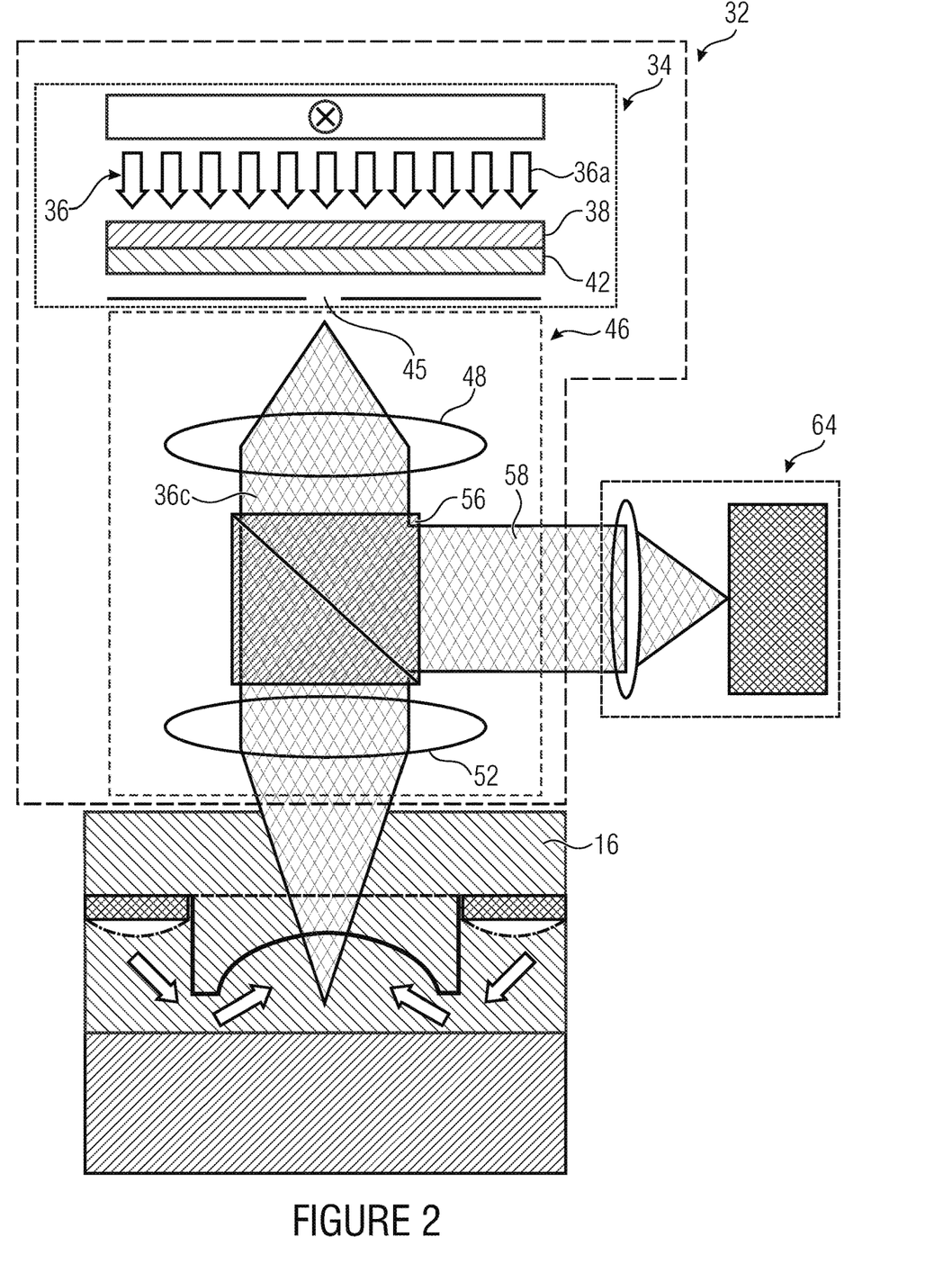
FIG. 2 is a schematic cross-sectional view of a device comprising an optical channel, ray-shaping optical elements and a ray-splitting optical element and a camera.

FIG. 2 shows the device 10 of FIG. 1 in which a ray-splitting optical element in the form of a beam splitter cube 56 is arranged in the two-lens optical path of the optical channel 46 and, in the ray direction, between the first ray-shaping optical element 48 and the second ray-shaping optical element 52.

The beam splitter cube 56 is configured to couple out part of the radiation 36c and is arranged such that a coupled out portion 58 is directed onto an image area of a camera 64. The camera 64 is configured to allow the emitted radiation 36 to be watched and evaluated. Evaluation may, for example, relate to the shape of the ray in section 36b or to the degree of scattering of the radiation by the diffusion disc 42. It is also conceivable for the intensity of the radiation 36 to be monitored in this way.

Although in FIG. 2 the ray-splitting optical element 56 is illustrated to be a beam splitter cube, it is also conceivable for a differently shaped ray-splitting optical element to be used, such as, for example, a pellicle or a beam splitter plate in order to couple out part of the radiation laterally.

Figure 3:
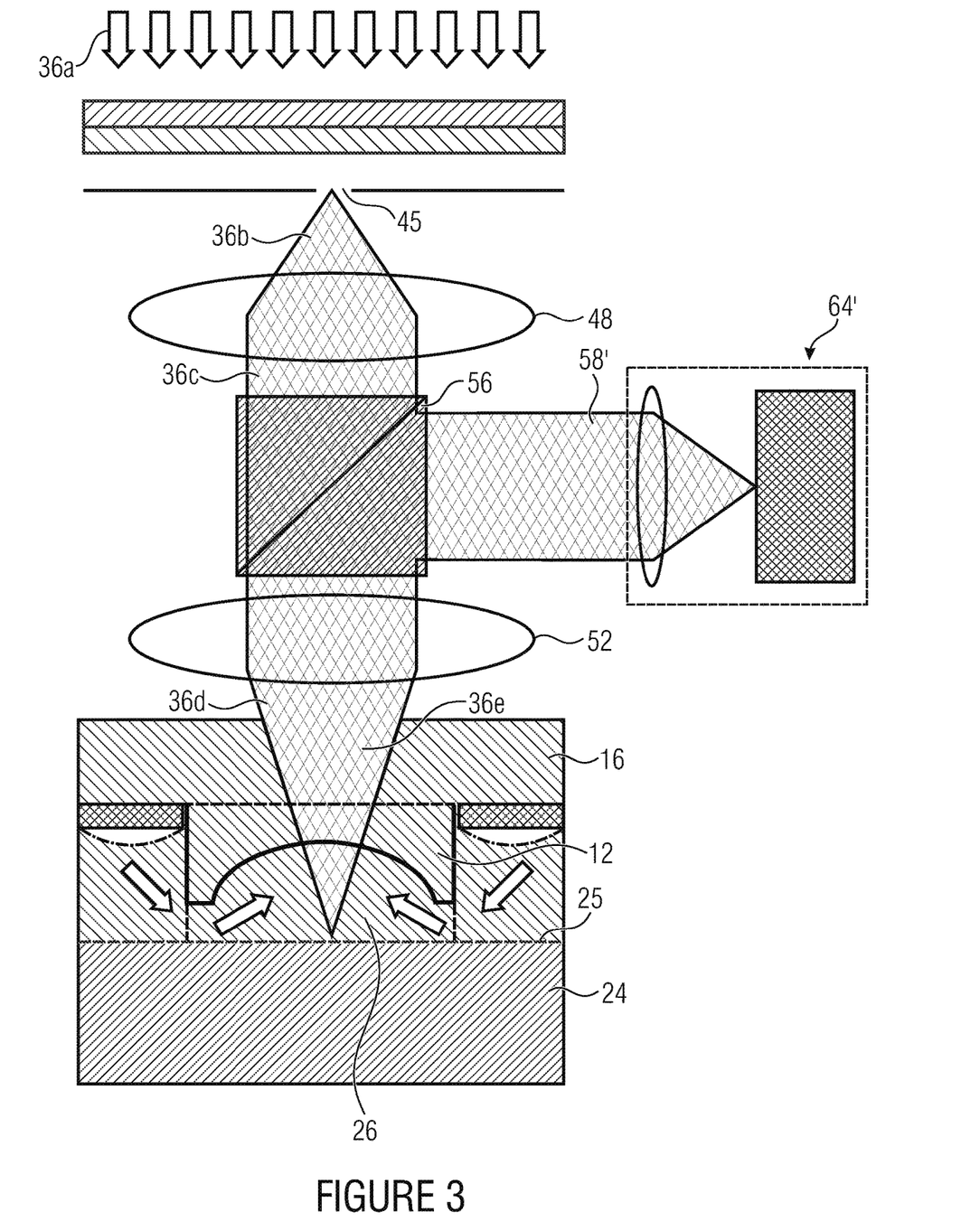
FIG. 3 is a schematic cross-sectional view of a device comprising an alternative ray-splitting optical element.

FIG. 3 shows a device, in analogy to device 10 in FIG. 2, wherein the beam splitter cube 56 is arranged such that part of radiation reflected back from the molding tool or the curing zone is coupled out and the part 58' coupled out of the reflected radiation is directed onto the image area of the camera 64' in order to allow the curing zone to be watched.

Although in FIG. 3 the ray-splitting optical element 56 is illustrated to be a beam splitter cube, in analogy to FIG. 2, a different implementation of the ray-splitting element is conceivable, such as, for example, a pellicle or a beam splitter plate.

When combining the embodiments of FIGS. 2 and 3, it is conceivable that, when combining watching and evaluating the radiation source with watching and evaluating the curing zone, a control or regulation circuit is set up by such that the radiation passing through the optical channel is influenced by the radiation source, the variable shutter or the ray-shaping optical elements such that curing may be optimized as is desired. Thus, when curing is observed to be too fast, this may be compensated by a stronger attenuating gray filter 38 such that the radiation intensity is reduced and thus curing is slowed down. Intervention in the curing process, such as, for example, adjusting the radiation intensity, may be done via an automatized control or regulation using which evaluation of the radiation source and/or the curing zone takes place. Alternatively or additionally, watching and/or evaluating the radiation source and/or the curing zone and intervention in the curing process may be done manually by an operator.

This may be done during a running process such that material rejects caused by possible production faults may be reduced.

Figure 4:
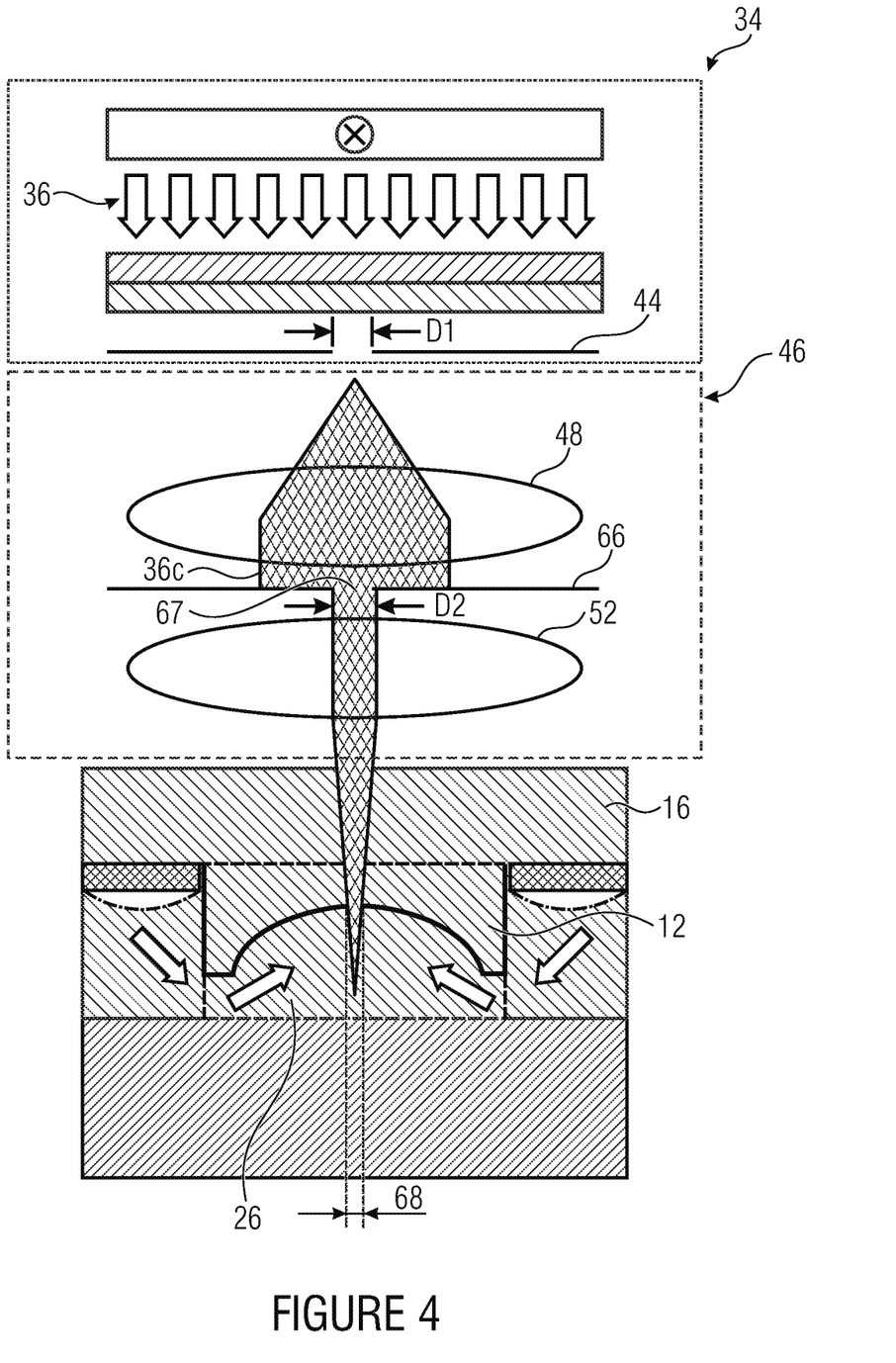
FIG. 4 is a schematic cross-sectional view of a device in which the optical channel includes a variable shutter.

Although, in FIGS. 3 and 4, a camera for watching the curing zone and the radiation source is illustrated, different kinds of image sensors are conceivable, such as, for example, an intensity meter.

FIG. 4 shows device 10 in which another variable shutter 66 is arranged, in the direction of rays, between the first ray-shaping optical element 48 and the second ray-shaping optical element 52. The further variable shutter 66 includes an aperture 67, variable in its size and lateral position, of a variable diameter D2. Due to the approximately parallel course of the rays of the radiation 36 in section 36c, linear scaling of the radiation power contained by the radiation 36 in the ray direction may be done by the variable aperture 67.

The variable shutter 66 is additionally configured to precisely adjust the lateral extension 68 in which the region 26 is irradiated by the radiation 36, since the irradiated region may be resolved laterally in a highly precise manner.

It is conceivable for the further variable shutter 66 described in FIG. 4 to be integrated in the control regulation circuit described before. This allows the manufacturing process to be optimized further.

Figure 5:
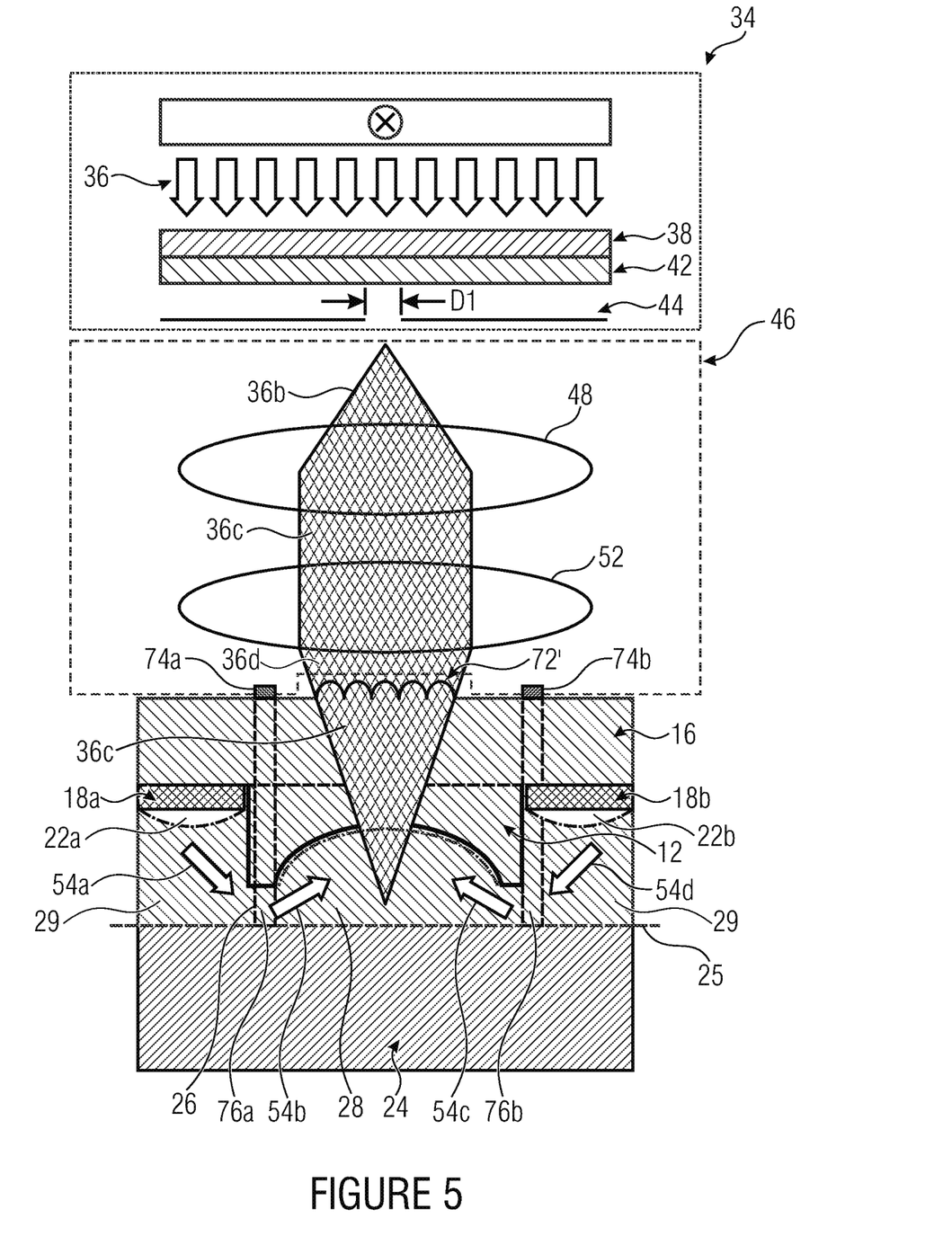
FIG. 5 is a schematic cross-sectional view of a device in which shutter structures and optical microstructures are arranged at the tool substrate.

FIG. 5 shows a device 10, in analogy to FIG. 1, having a two-lens optical path, wherein microstructures 72 for locally setting the divergence of illumination and shutter structures 74a and 74b for shielding the regions 76a and 76b from radiation are arranged at the substrate of the molding tool.

A strongly directed irradiation of the curable material 28 may result in refraction index gradients in the curable material 28 to form, which in turn may result in streaks and thus a degraded optical function of the cured material. Avoiding streaks from forming may thus be achieved by means of diffuse irradiation. Using the local microstructures 72 allows incident radiation to be diffused and thus results in a locally increased divergence of the radiation, which avoids streaks from forming. The light transmitted by the optics may be scattered locally and the directional effect of upstream optics may be eliminated partly or completely.

Instead of the microlenses 72 shown, diffractive elements, surface or volume diffusers may also be arranged at the tool substrate for diffusing the incident radiation. These elements, like the microlenses, may be implemented on one or both sides, to be continuous or discontinuous and be arranged at one or several sides of the tool or tool substrate. The elements for locally diffusing may also be arranged at the substrate in order to locally diverge radiation impinging on the curable material through the substrate.

The shutter structures 74a and 74b serve for shielding regions 76a and 76b which are not to be cured while irradiating through the molding tool 12 or the tool substrate 16 or the membrane structures 18a, 18b. The shutters structures 74a and 74b shield the radiation 36 such that the channel-like shadows 76a and 76b are formed. The curable material 28 or the further curable material 29 remains uncured in the regions of the shadows 76a and 76b while irradiating. After a cleaning or developing process subsequent to curing, no curable material is arranged in these regions. These regions may exemplarily be employed for introducing a solvent or for solving soluble curable material in order to generate air gaps.

The arrangement of microstructures or shutter structures extends the field of application of ray-shaping devices in that additional degrees of freedom with regard to the design and improved quality of the molded structures may be achieved.

Figure 6A:
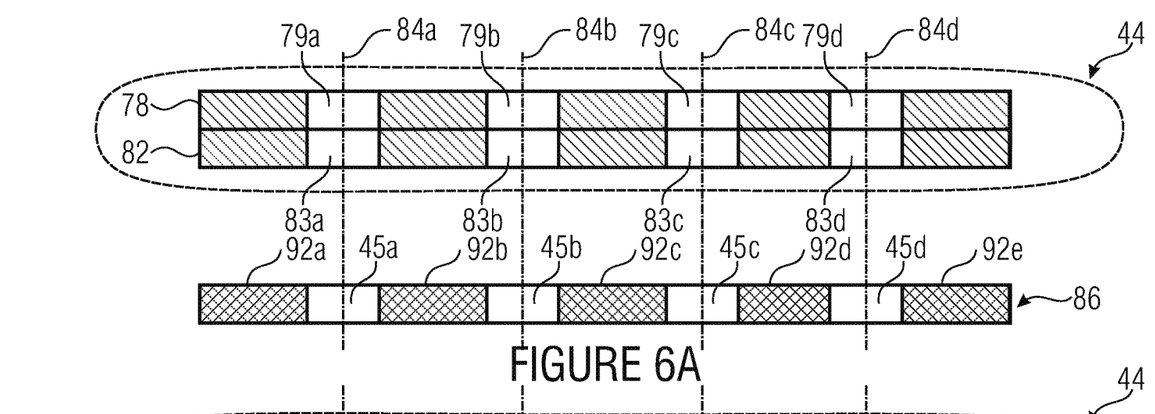
FIGS. 6a-c are schematic illustrations of a variable shutter.
Figure 6B:
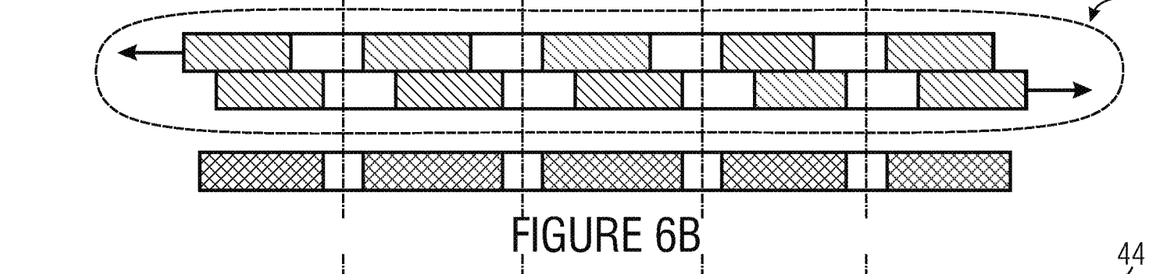
Figure 6C:
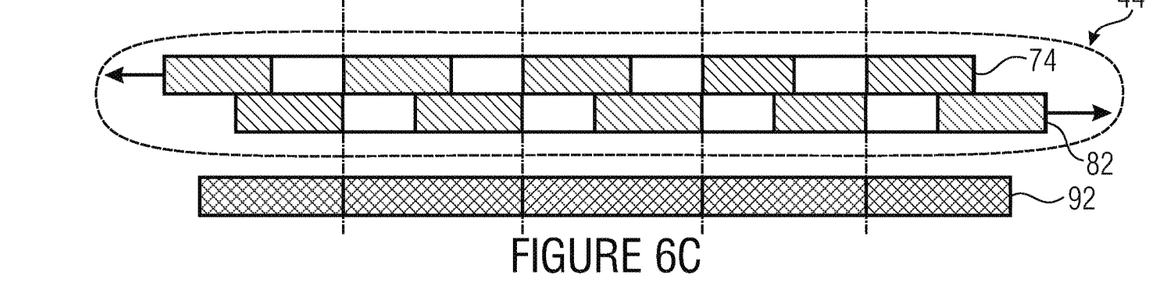

FIGS. 6a-c show schematic illustrations of a realization of a variable shutter 44. In FIG. 6a, a first shutter 78 comprising several apertures 79a-d is arranged opposite a second shutter 82 comprising several apertures 83a-d such that the apertures 79a-d and 83a-d together include optical axes 84a-d. The first shutter 78 and the second shutter 82 are implemented identically. The first shutter 78 and the second shutter 82 form a common effective shutter 86 by being arranged adjacent to each other.

Thus, the effective shutter 86 includes variable transmission regions 45a-d and the effective shadow regions 92a-e.

FIG. 6b illustrates the effect on the effective shutter 86 when shifting the first shutter 78 and the second shutter 82 relative to each other around the optical axes 84a-d. When the shutter 78 is shifted in one direction laterally to the optical axes 84a-d and the second shutter 82 is shifted laterally in an opposite direction, the result, compared to FIG. 6a, will be reduced variable transmission regions 45a-d and increased variable shadow regions 92a-e of the effective shutter 86, wherein, however, the centers of the respective transmission regions and thus the optical axes remain stationary.

FIG. 6c shows that shifting the first shutter 78 and the second shutter 82 in opposite directions laterally to the optical axes 84a-d may be continued until the entire region of the effective shutter 86 comprises the shadow region 92 and variable transmission regions 45 exhibit a size zero.

When manufacturing a plurality or field of structures, the distance of the apertures 79a-d or apertures 83a-d corresponds to the single or a multiple of the distance of the structures or lenses to be manufactured. The apertures 79 and 83 thus may exemplarily comprise simple rectangular or round openings.

Figure 7:
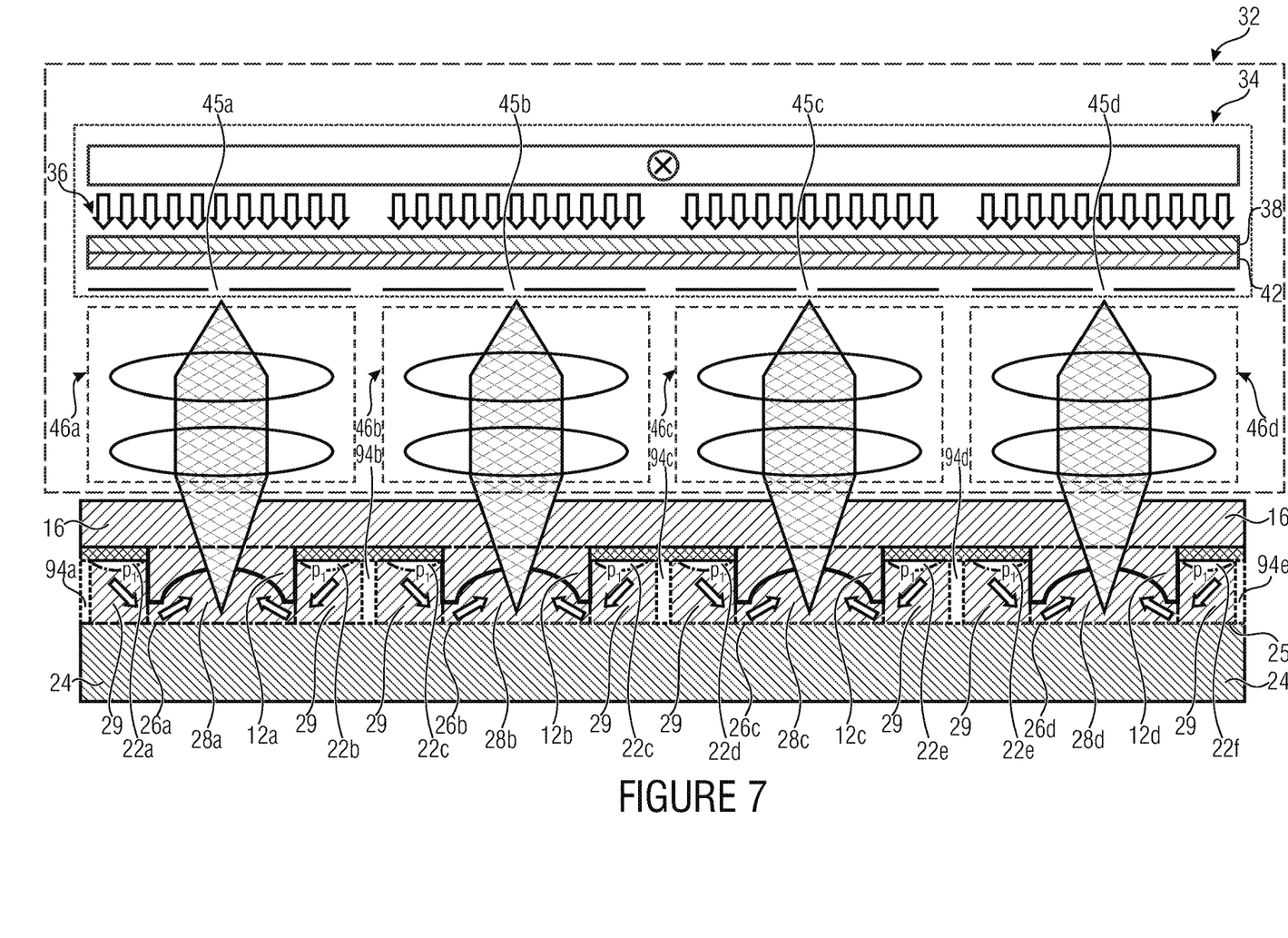
FIG. 7 is a schematic cross-sectional view of a device for irradiating in a locally varying manner by means of a variable shutter and several molding tools arranged next to one another.

FIG. 7 shows a device 20 which comprises four molding tools 12a-d. The radiation source 34 is configured to provide the radiation 36. In analogy to the device 10, one optical channel 46a-d each is arranged adjacent to each curing region 26a-d. The variable shutter 44 comprises a variable emission area 45a-d axially adjacent to the four optical channels 46a-d. The variable gray filter 38 and the diffusion disc 42 are configured to filter and scatter the radiation 36 simultaneously for each of the four optical channels 46a-d. The diffusion disc 42 is configured to scatter incident radiation 36 such that scattered radiation enters into each of the four optical channels 46a-d.

The channel structures 22a-f arranged at the tool substrate 16 are connected among one another fluidically. The fluidic connection of the channel structures 22a-f results in a pressure $p_1$ to be applied in one of the channel structures 22a-f to result in the pressure $p_1$ t form in the fluidically connected further channel structures as well.

The molding tools 12a-d are arranged at the common tool substrate 16. The molding tools 12a-d, however, are configured to mold the regions 26a-d on the substrate 24 having the surface 25.

Although, in FIG. 7, the molding tools are arranged at a common tool substrate and the regions 26a-d are molded at the surface of the common substrate, it is also possible for the tool substrate and/or the substrate to be formed of several individual components.

Curable material 94a-d which separates the regions 26a-d from one another such that further curable material 29 may flow only in one laterally adjacent region 26a-d, but not in another compensation region, is arranged laterally adjacent to and between two compensation regions each where the further curable material 29 is arranged. The cured material 94a-e may exemplarily be arranged such that the further curable material 29 is cured in edge regions of the compensation regions which are laterally outside relative to the regions 26a-d between a step of arranging curable and further curable material 28 and 29 and irradiating the regions 26a-d.

The radiation source 34 which is arranged axially to several optical channels and, thus, implemented over a large area is configured to emit collimated radiation in the region axially adjacent to the optical channels 46a-d. The diffusion disc 42, in contrast, is configured to eliminate collimation and act as a point-shaped radiation source relative to the variable emission areas 45a-e and the optical channels 46a-d arranged downstream in the ray direction.

Although, in the above embodiments, an optical channel includes two ray-shaping optical elements each, it is also conceivable for only one ray-shaping optical element or several ray-shaping optical elements to be comprised by an optical channel.

Although the ray-shaping optical elements 48 and 52 have been illustrated as lenses in previous embodiments, it is also conceivable for an optical channel to include one or several further ray-shaping optical elements, for example a prism, a diffractive structure or a Fresnel lens. The ray-shaping optical elements may be implemented to be equal or differing from one another and optical channels may differ from one another in that different optical channels include different ray-shaping optical elements. Furthermore, in the case of an implementation in analogy to FIG. 7 with several optical channels, it is conceivable for only some optical channels to include ray-splitting optical elements in order to realize a control or regulation circuit. Principally, each optical channel may be realized independently of other optical channels.

Figure 8:
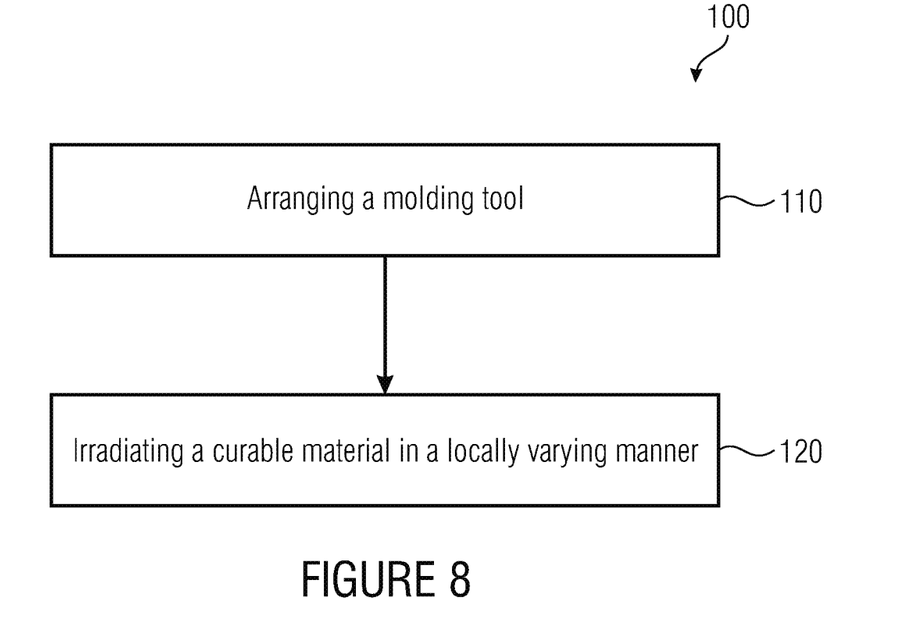
FIG. 8 shows a flowchart of a method of manufacturing a structure made of a curable material.

FIG. 8 shows a flowchart of a method 100 in accordance with an embodiment of the present invention. The method 100 of manufacturing a structure made of a curable material by means of molding includes a first step 110 of arranging a molding tool 12 above a surface 25, exemplarily a glass substrate, such that, in a region 26 between the molding tool 12 and the surface 25, the curable material 28, exemplarily an UV-polymer, abuts on the surface 25 and a molding surface 14, facing the surface 25, of the molding tool 12 and such that further curable materials 29 may continue to flow or reflow to the region 26. Furthermore, the method 100 includes a second step 120 of irradiating the curable material 28 in the region by means of a ray 36 in a locally varying manner, the ray crossing an optical channel 46 arranged between a radiation source 34 and a molding tool 12 and experiencing ray focusing while crossing such that the curable material 28 cures with a different speed laterally along the surface 25 and shrinking of the curable material 28 when curing is compensated by the further curable material 29.

Further curable material 29 continuing to flow in the region 26 here may exemplarily be induced by applying the pressure $p_1$ in the channel structures 22a and 22b and thus applying a pressure to the further curable material 29. Alternatively or additionally, it is conceivable for the further curable material 29 to be provided with a pressure from a lateral side in order to cause the further curable material 29 to continue to flow to the region 26. When applying the pressure $p_1$ while irradiating, the further curable material 29 continues to flow to the region 26 during shrinking.

Figure 9:
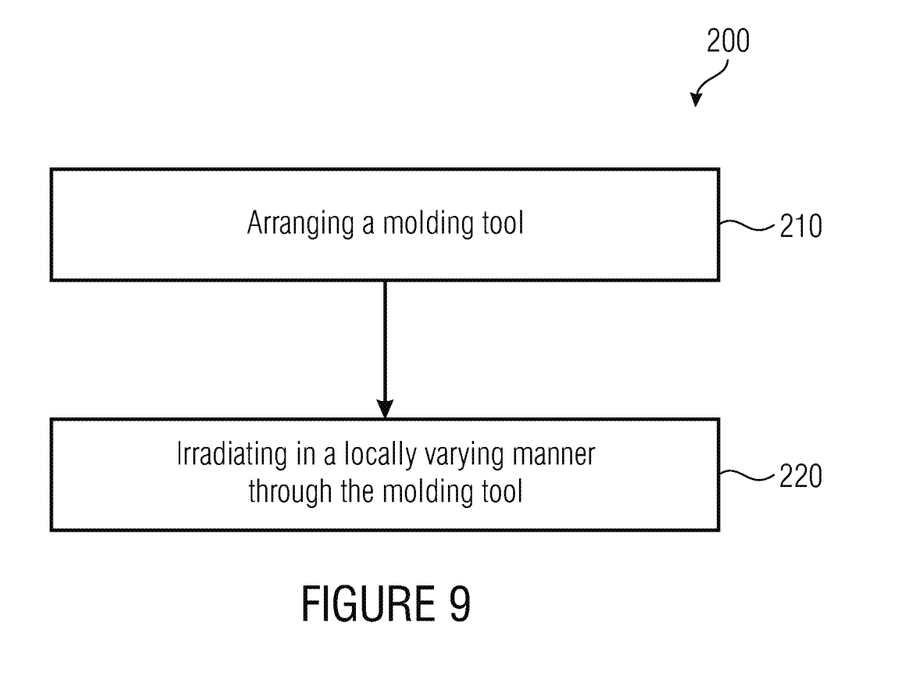
FIG. 9 shows a flowchart of an alternative method of manufacturing a structure made of a curable material.

FIG. 9 shows a flowchart of a method 200 in accordance with an embodiment of the present invention. The method 200 of manufacturing a structure made of a curable material by means of molding includes a first step 210 of arranging a molding tool 12 above a surface 25, exemplarily a glass substrate, such that, in a region 26 between the molding tool 12 and the surface 25, the curable material 28 abuts on the surface 25 and a molding surface 14, facing the surface, of the molding tool 12 and such that further curable material 29 may continue to flow to the region 26. In addition, the method 200 comprises a second step 220 of irradiating the curable material 28 in a locally varying manner in the region by means of a ray 36 which crosses an optical channel 46 arranged between the radiation source 34 and the molding tool 12 and experiences ray focusing while crossing such that the curable material 28 cures at a different speed laterally along the surface 25 and shrinking when curing the curable material 28 is compensated by the further curable material 29, wherein irradiating in a locally varying manner is performed from a side of the molding tool 12, facing away from the molding surface 14, through the molding tool 12.

More precise molds of optical and mechanical components, in particular for large structural heights of several hundred micrometers, may be achieved by compensating the volume shrinkage of the curable material while curing. This is a prerequisite for manufacturing microscopic and micromechanical components as are, above all, necessitated when manufacturing imaging systems on the wafer level. In addition, mechanical tension which is also caused by the shrinking process, is reduced. As a consequence, bending of the substrate, exemplarily of a wafer, may be reduced and such wafers be processed to form more complex stacks, as is, among other things, necessitated when manufacturing camera modules on the wafer level. Using ray-shaping optics extends the possibilities of controlling the curing process and allows further improving the contour fidelity.

In other words, improving the curing process serves, among other things, optimized manufacturing of micro-optical electromechanical systems (MOEMS) by replication processes, such as, for example, wafer-level manufacturing of camera objectives and optical sensors.

In addition to the temporally-spatially controlled irradiation of the curable material by means of UV radiation while at the same time providing the further curable material with a pressure while using flexible membrane structures integrated in the tool for compensating shrinkage, optical elements which allow ray-shaping of the curing UV radiation are provided per structure to be cured.

Figure 10:
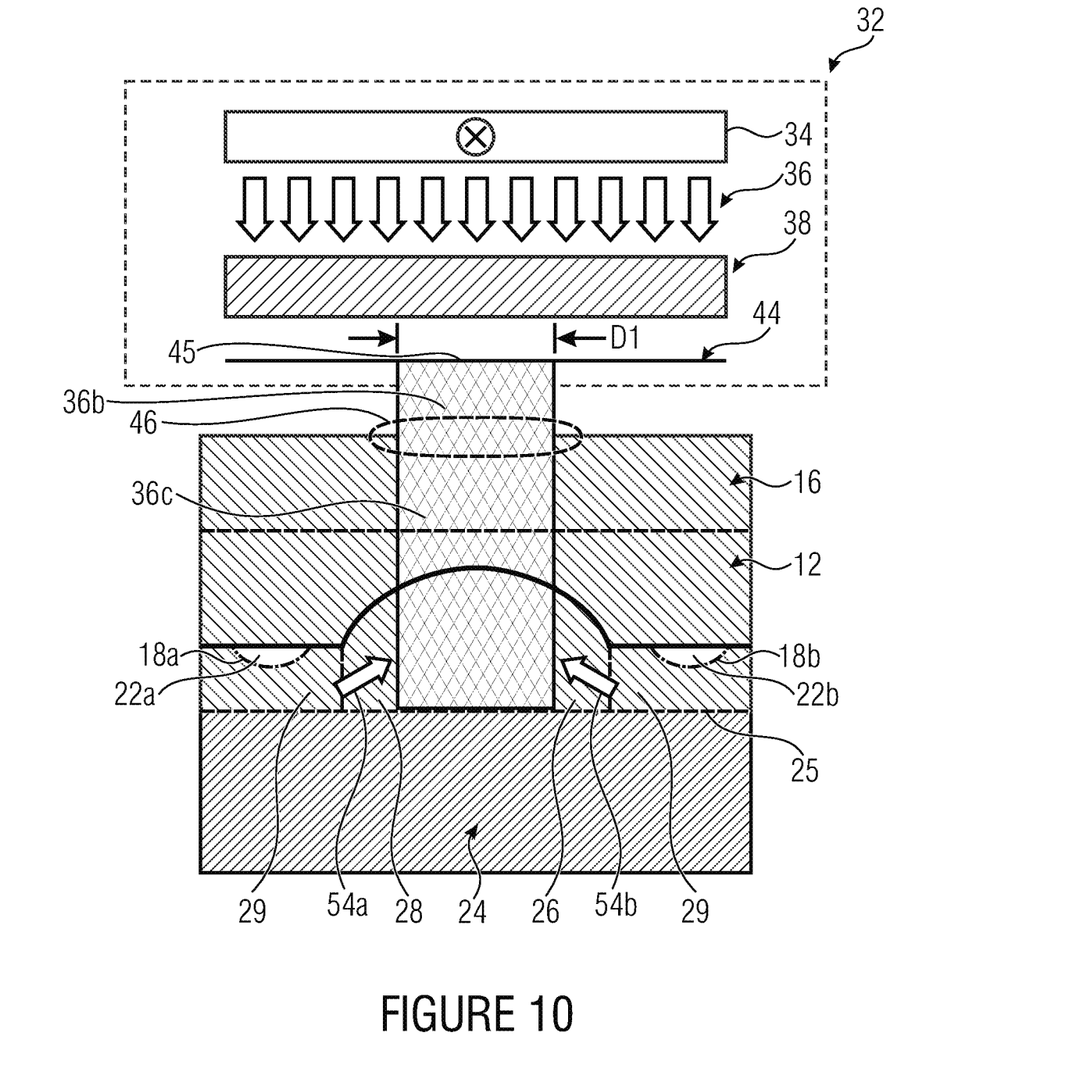
FIG. 10 is a schematic cross-sectional view of a device for manufacturing a structure made of a curable material.

FIG. 10 shows a device for irradiating in a locally varying manner in accordance with the known technology. The device comprises the irradiation unit 32 and the shaping tool 12 which is arranged at the tool substrate 16. The curable material 28 is arranged between the substrate 24 and the shaping tool 12, wherein the shaping tool is arranged opposite the surface 25, facing the shape tool 12, of the substrate 24 such that shrinkage occurring while irradiating in the curable material 28 may be compensated by the further curable material 29 continuing to flow 54a and 54b.

In contrast to the above embodiments which relate to a further development of the known technology, the optical channel 46 does not include any ray-shaping optical elements between the irradiation unit 32 and the substrate of the molding tool 16. The variable shutter 44 and the variable emission area 45 having a diameter of D1 are configured to restrict the radiation 36 and thus allow locally varying irradiation. However, this arrangement does not allow focusing of the radiation 36 in the curing zone, nor imaging the radiation 36 or the curing zone in the region 26 onto a camera.

In contrast to the above embodiments, the membrane structures 18a and 18b are arranged directly at the shaping tool 12. However, configuration of the membrane structures 18a and 18b and the channel structures 22a and 22b and thus the function thereof with regard to applying an external pressure to the further curable material 29 are identical.

A considerable advantage of the above embodiments compared to the known technology illustrated in FIG. 10 is integration of the ray-shaping optical elements in the optical channel such that, on the one hand, the radiation may be focused in the curing zone and, on the other hand, control or regulation of the curing process may be realized in the way described above.

FIG. 11 shows an exemplary flow of sequential molding and curing processes in a Step & Repeat machine, which may, for example, be an adapted nano-imprint lithography apparatus. In a first step A, a defined quantity of polymer to be cured is deposited on the substrate such that a drop of polymer forms on the substrate. Subsequently, in step B, a molding tool is positioned on the drop such that the drop takes the shape of the lens to be on the one hand and may be positioned on the substrate using the molding tool on the other hand.

Subsequently, in step C, the polymer is cured by means of UV radiation, wherein the UV radiation may exemplarily cause curing of the polymer through a transparently implemented molding tool or through the substrate.

After curing the polymer, the molding tool is removed and positioned on a further drop of polymer positioned there in the meantime in order to mold the next lens. In this way, all of the lenses to be molded are applied on the substrate one after the other.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

The invention claimed is:

1. A method of manufacturing a structure made of a curable material by means of molding, the method comprising:
    arranging a molding tool above a surface such that the curable material abuts on the surface and a molding surface, the molding surface being arranged towards the surface, of the molding tool in a region between the molding tool and the surface and such that further curable material may continue to flow to the region;
    irradiating the curable material in the region in a locally varying manner such that the curable material cures at different speeds laterally along the surface and shrinking when curing the curable material is compensated by the further curable material, wherein irradiating in the locally varying manner is performed from a side of the molding tool opposing the molding surface and through the molding tool,
    wherein irradiating in the locally varying manner is performed by means of a ray crossing an optical channel arranged between a radiation source emitting radiation and the molding tool such that the ray is focused by a ray-shaping optical element so as to experience ray focusing while crossing the optical channel;
    wherein part of the radiation used for curing the curable material and reflected from the molding tool is coupled out by a ray-splitting element comprised by the optical channel and the part of the radiation coupled out is imaged onto an image sensor to control the radiation curing the curable material.

2. The method in accordance with claim 1,
    wherein an external pressure is applied to the further curable material while irradiating.

3. The method in accordance with claim 1,
    wherein irradiating in the locally varying manner takes place at least partly through a structure for ray diffusion.

4. The method in accordance with claim 1,
    wherein irradiating in the locally varying manner is performed such that the further curable material continues to flow from a compensation region of the molding tool to the region, wherein the compensation region is not reached by the ray used for irradiating the curable material.

5. The method in accordance with claim 4, further comprising:
    curing a portion of the curable material to an edge region which laterally completely encloses the compensation region, between arranging the molding tool and irradiating in the locally varying manner.

6. The method in accordance with claim 1,
    wherein a plurality of structures are manufactured; and
    wherein the local variation of irradiating is done by means of setting a variable shutter unit comprising fixed individual shutters, wherein a distance of the individual shutters corresponds to a single or multiple distances of the structures to be manufactured.

7. The method in accordance with claim 2,
    wherein arranging and irradiating in the locally varying manner are additionally performed using a further molding tool in order to manufacture another structure;
    wherein channel structures of the molding tool are fluidically connected to channel structures of the further molding tool; and
    wherein, when applying the external pressure to the further curable material while irradiating, the pressure is applied in the channel structures of the molding tool and the further molding tool.

8. The method in accordance with claim 7,
    wherein the structure is a first structure, cured by use of the optical channel being a first optical channel and being associated with the first structure;
    wherein one or several further structures are cured at one time by use of a corresponding number of further optical channels and the radiation for curing the curable material is emitted by at least one radiation source;
    wherein each further structure is associated with one of the further optical channels;
    wherein the radiation leaves an emission area in a diffuse manner and crosses the associated optical channel in the direction of each structure to be manufactured.

9. The method in accordance with claim 1, wherein the structure comprises a lens.

10. The method in accordance with claim 1, further comprising watching, with a camera having the image sensor that receives the part of radiation reflected from the molding tool which is coupled out with the ray-splitting element, a curing zone where the molding tool is arranged and whilst irradiating the curable material.

11. The method in accordance with claim 1, further comprising:
    evaluating the curing zone based on imaging the part of the radiation being coupled out on the image sensor to determine a speed of the curing; wherein
    controlling the radiation curing the curable material comprises increasing a strength of an attenuating gray filter such that a radiation intensity is reduced and thus the curing is slowed down, when the speed of the curing is observed to be above a threshold to provide for an online-monitoring of the curing.

12. The method in accordance with claim 1, further comprising coupling out part of the ray in a region where the radiation is collimated whilst irradiating the curable material and directing the part coupled out to a projection or image area such that an emission area is imaged onto a further image sensor to provide for an online-monitoring of the curing.

13. The method of claim 5, wherein the edge region encompasses the compensation region such that the compensation region is arranged between the edge region and the region into which the additional material flows.

14. The method of claim 1, wherein the part of the radiation used for curing the curable material is coupled out in a region where the ray-shaping optical element focusses the radiation to a collimated radiation.

15. The method of claim 1, wherein a diffuse radiation is used to irradiate the region.

16. The method of claim 1, wherein a plurality of regions comprising the region are commonly illuminated by a radiation source providing for diffuse radiation, the radiation source arranged axially to several optical channels, the ray-splitting element arranged in a single optical channel.

* * * * *